(12) United States Patent
Tokumitsu et al.

(10) Patent No.: US 7,561,001 B2
(45) Date of Patent: Jul. 14, 2009

(54) ELECTRONIC OSCILLATOR CIRCUIT DEVICE

(75) Inventors: Tsuneo Tokumitsu, Yamanashi (JP); Osamu Baba, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 104 days.

(21) Appl. No.: 11/878,707

(22) Filed: Jul. 26, 2007

(65) Prior Publication Data

US 2008/0048764 A1 Feb. 28, 2008

(30) Foreign Application Priority Data

Jul. 27, 2006 (JP) .............................. 2006-204964

(51) Int. Cl.
*H03B 5/08* (2006.01)
(52) U.S. Cl. .................... 331/167; 331/185; 331/74; 331/117 R; 331/117 FE; 331/175
(58) Field of Classification Search ............. 331/167, 331/117 R, 117 FE, 74, 175, 185
See application file for complete search history.

(56) References Cited

U.S. PATENT DOCUMENTS 5,341,111 A 8/1994 Miya et al.

| 5,440,276 A | 8/1995 | Kim |
| 5,697,095 A | 12/1997 | Matsuura |

FOREIGN PATENT DOCUMENTS

| EP | 1 081 847 A1 | 3/2001 |
| JP | 6-224632 A | 8/1994 |
| JP | 2000-156611 A | 6/2000 |
| JP | 2007-104436 A | 4/2007 |

OTHER PUBLICATIONS

Japanese Office Action dated Jul. 22, 2008 (mailing date), issued in corresponding Japanese Patent Application No. 2006-204964.
European Office Action dated Nov. 30, 2007, Application No. 07113024.9-2215.

*Primary Examiner*—Arnold Kinkead
(74) *Attorney, Agent, or Firm*—Westerman, Hattori, Daniels & Adrian, LLP.

(57) ABSTRACT

An electronic circuit device includes a negative resistance generating circuit, a second transistor and a path. The negative resistance generating circuit has a first transistor having a control terminal coupled to a resonator. The second transistor has a control terminal coupled to an output terminal of the first transistor and has an output terminal coupled to a DC bias terminal. The path is coupled to between the DC bias terminal and an output terminal of the first transistor through the second transistor and provides a bias to the first transistor.

5 Claims, 7 Drawing Sheets

ELECTRONIC OSCILLATOR CIRCUIT DEVICE

BACKGROUND OF THE INVENTION

1. Field of the Invention

This invention generally relates to an electronic circuit device, and in particular, relates to an electronic circuit device in which a DC bias is applied to two transistors in series.

2. Description of the Related Art

An oscillator is used in a device using a high frequency wave such as a communication device. It is difficult to manufacture a high-performance oscillator using a high frequency wave such as a milliwave. There is a case where a signal of relatively low frequency from the oscillator is multiplied into a second harmonic wave and a third harmonic wave by a frequency multiplier and is used. The frequency multiplier is a circuit that outputs a distorted waveform including a non-linear signal such as a higher harmonic component (a second harmonic wave or a third harmonic wave) and outputs a signal of desirable frequency (a second harmonic wave or a third harmonic wave) through a filter. Japanese Patent Application Publication No. 2000-156611 discloses a frequency multiplier using a transistor.

Generally, an electrical power of a high frequency component is smaller than that of a reference wave, in a frequency multiplier. A multiplication loss is therefore generated with respect to the reference wave. And an insertion loss of a filter is generated when the filter is used. Therefore, a signal level is reduced when the frequency multiplier multiplies an output signal from the oscillator. And so, an amplifier is provided at the backside of the frequency multiplier, when the frequency multiplier is used. In this case, a size of the circuit is enlarged. For example, a chip size is enlarged when the circuit is a MMIC (Microwave Monolithic Integrated Circuit).

SUMMARY OF THE INVENTION

The present invention provides an electronic circuit device having a small multiplication loss and multiplying an output frequency of an oscillator with a small circuit.

According to an aspect of the present invention, preferably, there is provided an electronic circuit device including a negative resistance generating circuit, a second transistor and a path. The negative resistance generating circuit has a first transistor having a control terminal coupled to a resonator. The second transistor has a control terminal coupled to an output terminal of the first transistor and has an output terminal coupled to a DC bias terminal. The path is coupled to between the DC bias terminal and an output terminal of the first transistor through the second transistor and provides a bias to the first transistor.

With the above-mentioned configuration, the first transistor and the second transistor enhance a nonlinearity with each other and output a harmonic wave having a large power level, because a DC bias is applied to the first transistor and the second transistor in series. Therefore, a multiplication loss is reduced and an output frequency of an oscillator may be multiplied with a small circuit.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1:
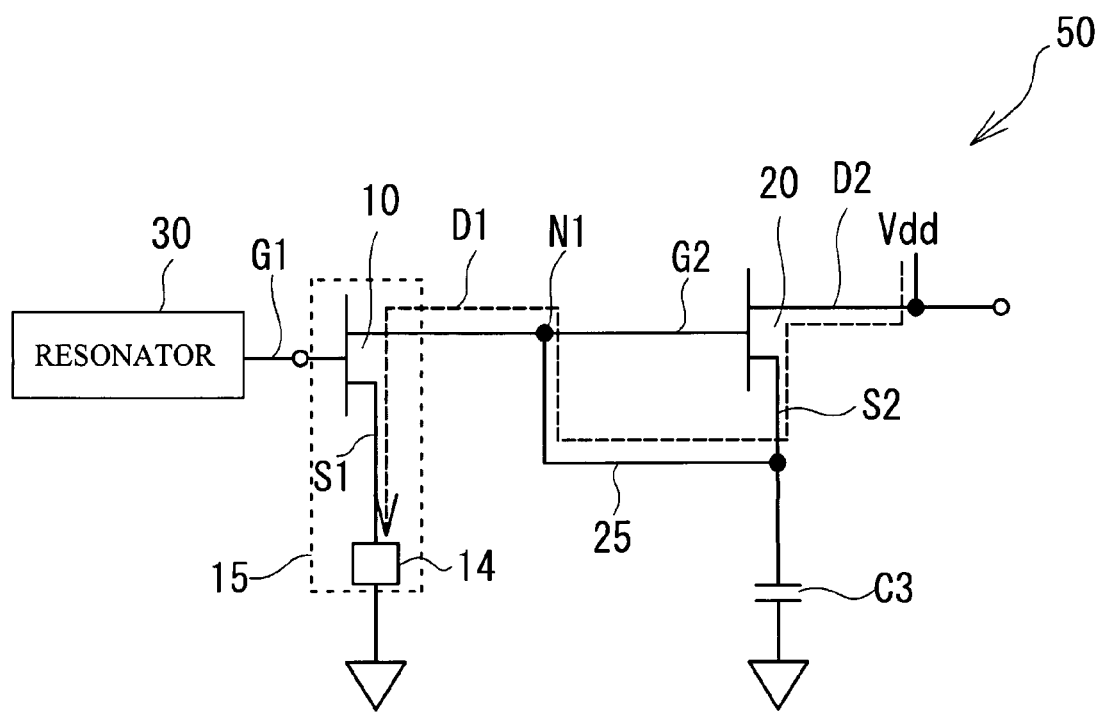
FIG. 1 illustrates a principle in accordance with the present invention.

A description will be given of a principle in accordance with the present invention with reference to FIG. 1. FIG. 1 illustrates the principle in accordance with the present invention. As shown in FIG. 1, an electronic circuit 50 has a first transistor 10 and a second transistor 20. The first transistor 10 has a source S1 (a second terminal) coupled to a negative resistance generator 14 and has a gate G1 (a control terminal) coupled to a resonator 30. A drain D1 (a first terminal) acts as an output terminal of the first transistor 10 and is coupled to a gate G2 that is a control terminal of the second transistor 20.

The second transistor 20 has a source S2 (a second terminal) coupled to the drain D1 through a path 25 different from the gate G2. The gate G2 of the second transistor 20 and the path 25 are coupled to a node N1. The source S2 is coupled to a ground through a capacitor C3. The drain D2 (a first terminal) is coupled to an electrical power supply Vdd (a DC bias terminal) and an output portion Out. A DC (DC: Direct Current) bias of the electrical power supply Vdd is applied to the second transistor 20 and the first transistor 10 through a dotted line shown in FIG. 1. That is, the second transistor 20 and the first transistor 10 are coupled to each other in series so that the DC bias is applied to the second transistor 20 and the first transistor 10 in series through the path 25. The capacitor C3 is a capacitor grounding a signal at high frequency wave to the ground.

The first transistor 10 and the negative resistance generator 14 compose a negative resistance circuit 15. The resonator 30 and the negative resistance circuit 15 act as an oscillator. The negative resistance generator 14 is, for example, a circuit composed of a negative resistance generating element such as a capacitor or of elements. The negative resistance generator 14 generates a negative resistance so that the negative resistance generator 14 and the first transistor 10 act as an oscillator, when the negative resistance generator 14 is coupled to the first transistor 10. An oscillation signal from the drain D1 of the first transistor 10 is a nonlinear large signal. A range of the linear signal is from a signal near the DC to a high frequency wave signal. The high frequency wave signal is mainly applied to the gate G2, because the high frequency wave signal is grounded through the capacitor C3. On the other hand, the signal near the DC is applied to the source S1 through the path 25. As mentioned above, the first transistor 10 and the second transistor 20 are coupled to each other in series with respect to the DC.

Therefore, with respect to a signal near the DC, an electrical potential difference is large between the source S2 and the drain D2 of the second transistor 20, when an electrical potential difference is small between the source S1 and the drain D1 of the first transistor 10. In contrast, the electrical potential difference is small between the source S2 and the drain D2 of the second transistor 20, when the electrical potential difference is large between the source S1 and the drain D1 of the first transistor 10. The source S2 of the second transistor 20 receives a signal near the DC of the nonlinear large signal from the first transistor 10. Therefore, nonlinearity of the signal is enhanced in the second transistor 20 and is output. Accordingly, with respect to an oscillation frequency from the drain D1, the nonlinear signal such as a second harmonic wave or a third harmonic wave is enlarged. Further, the second transistor 20 acts as an amplifier, because the second transistor 20 is grounded through the source. The electronic circuit 50 may generate a second harmonic wave and a third harmonic wave having a high electrical power level.

First Embodiment

Figure 2:
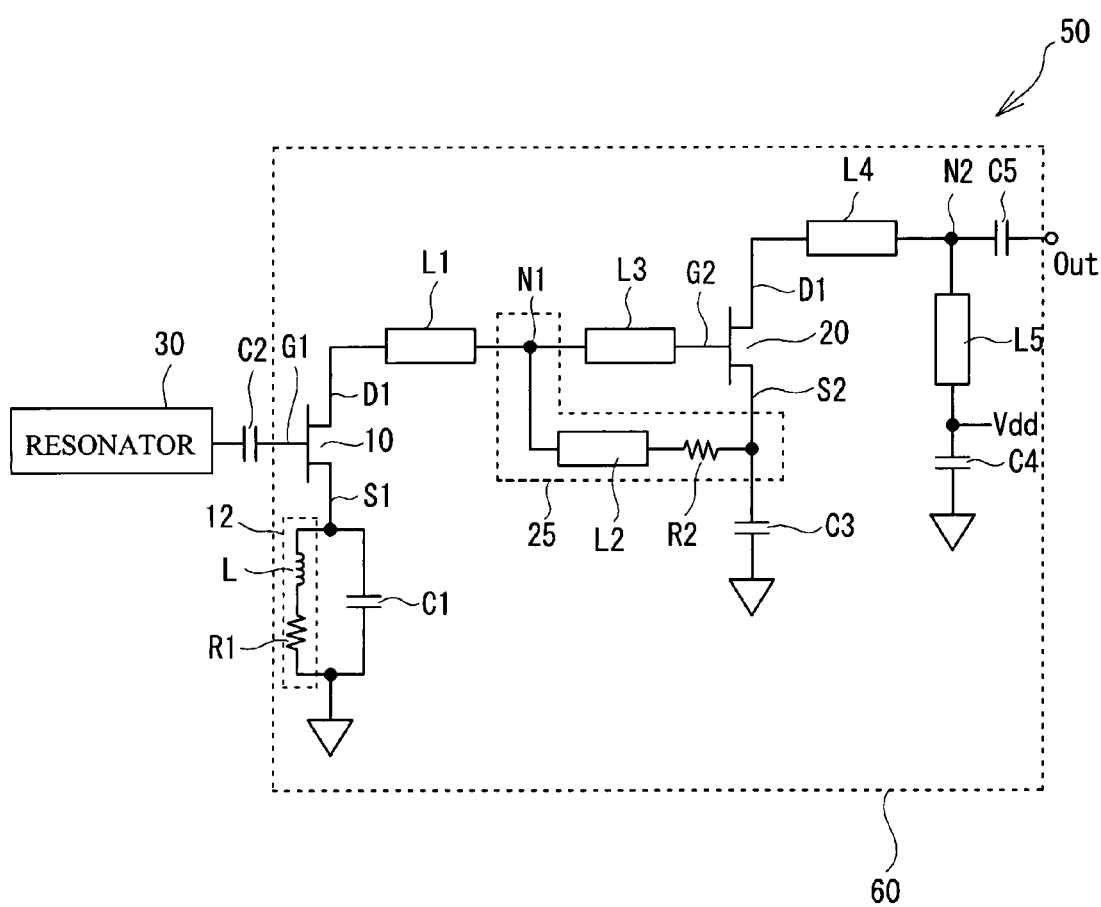
FIG. 2 illustrates a circuit diagram in accordance with a first embodiment.

FIG. 2 illustrates a circuit diagram in accordance with a first embodiment. An inductor L and a resistor R1 are coupled to the source S1 of the first transistor 10 in parallel with the capacitor C1. The inductor L and the resistor R1 compose a bias circuit 12. The capacitor C1 and the bias circuit 12 compose a negative resistance generator. The capacitor C1 mainly generates a negative resistance. The bias circuit 12 is a direct current path to which a part of the DC bias applied to the electrical power supply Vdd is applied. The bias circuit 12 regulates a level of the source S1 of the first transistor 10. A capacitor C2 is coupled to between the first transistor 10 and the resonator 30. An element L1 having an inductance component is coupled to between the first transistor 10 and the node N1. An element L3 having an inductance component is coupled to between the node N1 and the gate G2 of the second transistor 20. An element L2 having an inductance component and a resistor R2 are coupled to between the node N1 and the source S2 of the second transistor 20. The drain D2 of the second transistor 20 is coupled to the output portion Out through an element L4 having an inductance component and a capacitor C5. A node N2 is between the element L4 and the capacitor C5 and is coupled to the electrical power supply Vdd through an element L5 having an inductance component. The electrical power supply Vdd is grounded through a capacitor C4.

Figure 3:
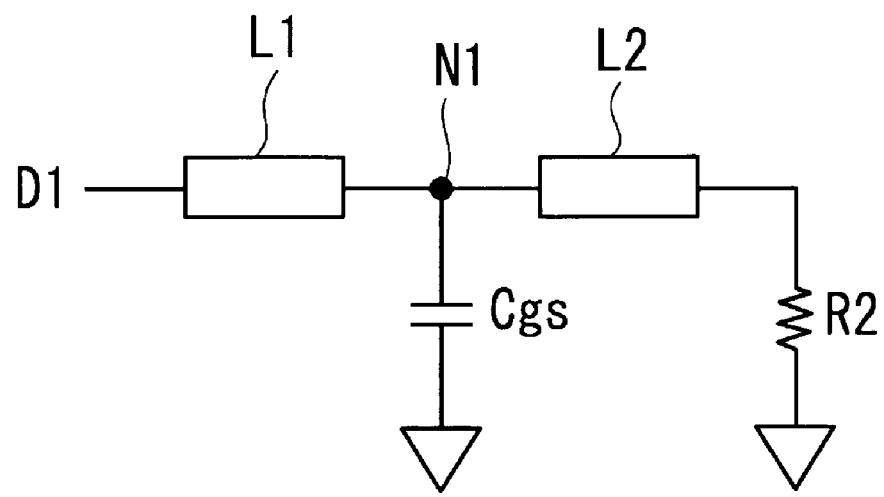
FIG. 3 illustrates a L-C-L circuit.

In FIG. 2, the element L1 (a first inductor), the element L2 (a second inductor) and a gate capacitance Cgs of the second transistor 20 act as an L-C-L circuit shown in FIG. 3. And a reflection gain with respect to the gate G1 of the first transistor 10 may be improved. The resistance R2 controls a flow of a high frequency wave signal from the first transistor 10 to the ground through the path 25 and a capacitor C3. The capacitors C3 and C4 ground the high frequency signal to the ground. The elements L4 and L5 and the capacitor C5 act as a matching circuit, match the output portion Out to 50Ω, and match impedance thereof so that a desirable wave of an extracted second harmonic wave and an extracted third harmonic wave is the largest.

The elements L1 through L5 having an inductance component may be an inductor of a lumped-parameter element. A micro strip line may be used as a distributed constant element. It is preferable that the resistor R2 is positioned at the source S2 side with respect to the element L2, when the micro strip line is used. This is because the element L2 and the resistor R2 act as a band-pass filter and efficiency is reduced when the element L2 and the resistor R2 are displaced to each other. It is preferable that the first transistor 10 and the second transistor 20 do not oscillate according to an electrical potential difference between the source S1 and the drain D1 of the first transistor 10 and an electrical potential difference between the source S2 and the drain D2 of the second transistor 20 when the resonator 30 is not provided. Therefore, it is preferable that a gate width of the first transistor 10 is approximately as same as that of the second transistor 20.

Figure 4:
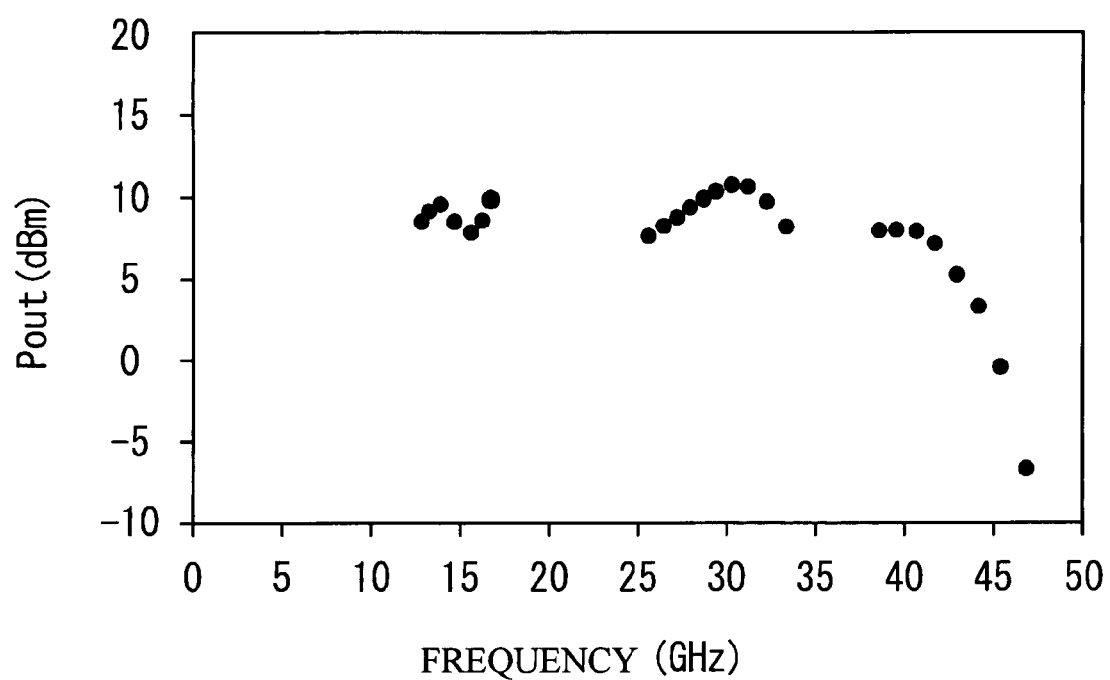
FIG. 4 illustrates a calculated output voltage with respect to a frequency in accordance with a first embodiment.

FIG. 4 illustrates a calculated output electrical power Pout of the output portion Out in the electronic circuit 50 with respect to a frequency at the output portion Out in a case where a HEMT (High Electron Mobility Transistor) is used as the first transistor 10 and the second transistor 20. The output electrical power Pout of a reference wave f0 at approximately 13 GHz to 17 Ghz is 10 dBm, and the output electrical power Pout of a second harmonic wave 2f0 and a third harmonic wave 3f0 is approximately 10 dBm.

Figure 5:
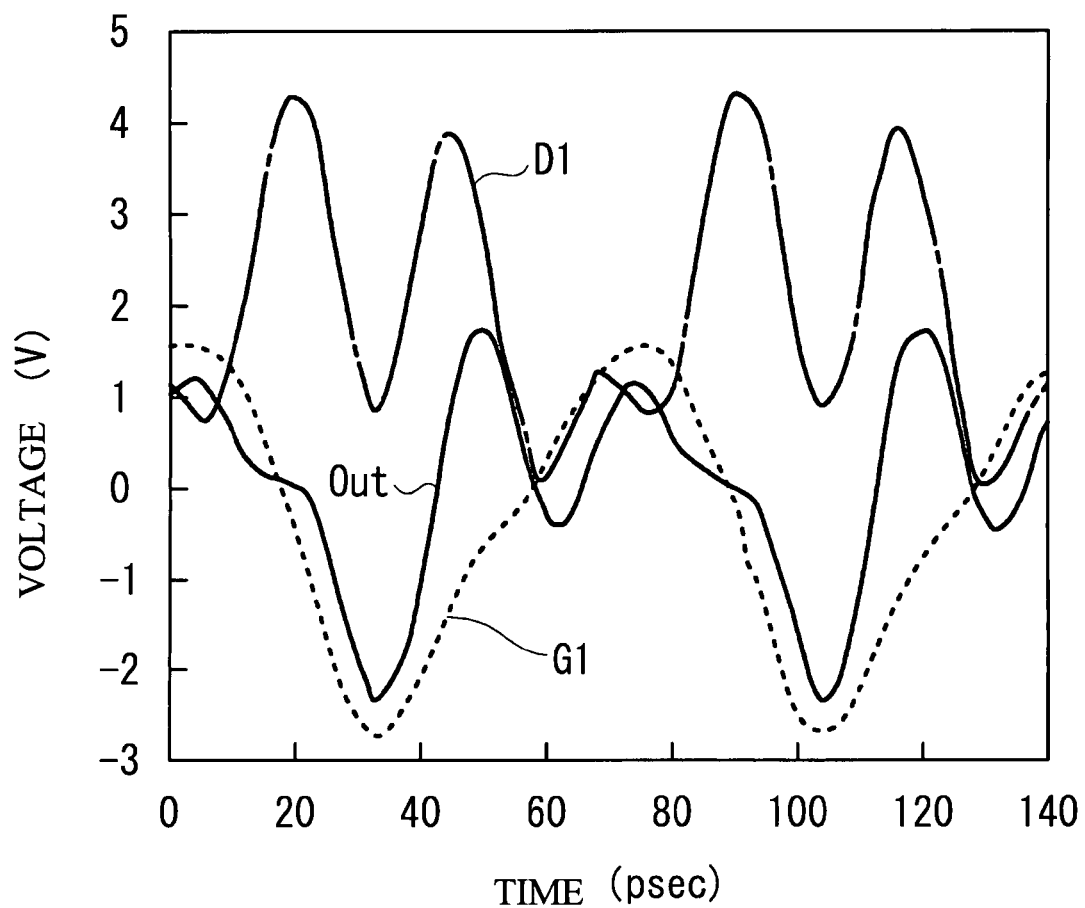
FIG. 5 illustrates a calculated waveform of each signal in accordance with a first embodiment.

FIG. 5 illustrates a calculated voltage waveform at the gate G1 and the drain D1 of the first transistor 10, and at the output portion Out of the electronic circuit 50. The voltage at the gate G1 is approximately a sine-waveform voltage. On the other hand, a nonlinear component of the voltage at the drain D1 of the first transistor 10 is enlarged. A nonlinear component of the voltage at the output portion Out is enlarged. And the voltage at the output portion Out is approximately a rectangular wave.

Figure 6:
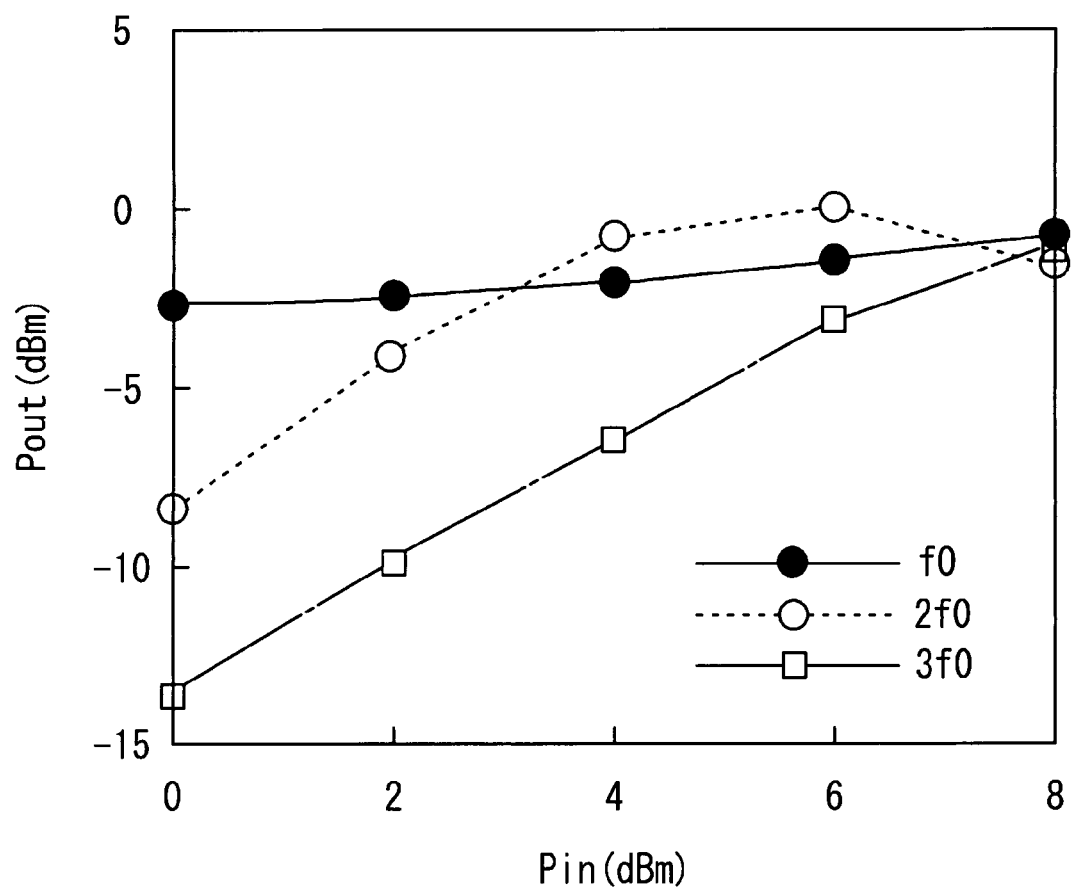
FIG. 6 illustrates a measured output of a reference wave, a second harmonic wave and a third harmonic wave.
Figure 7:
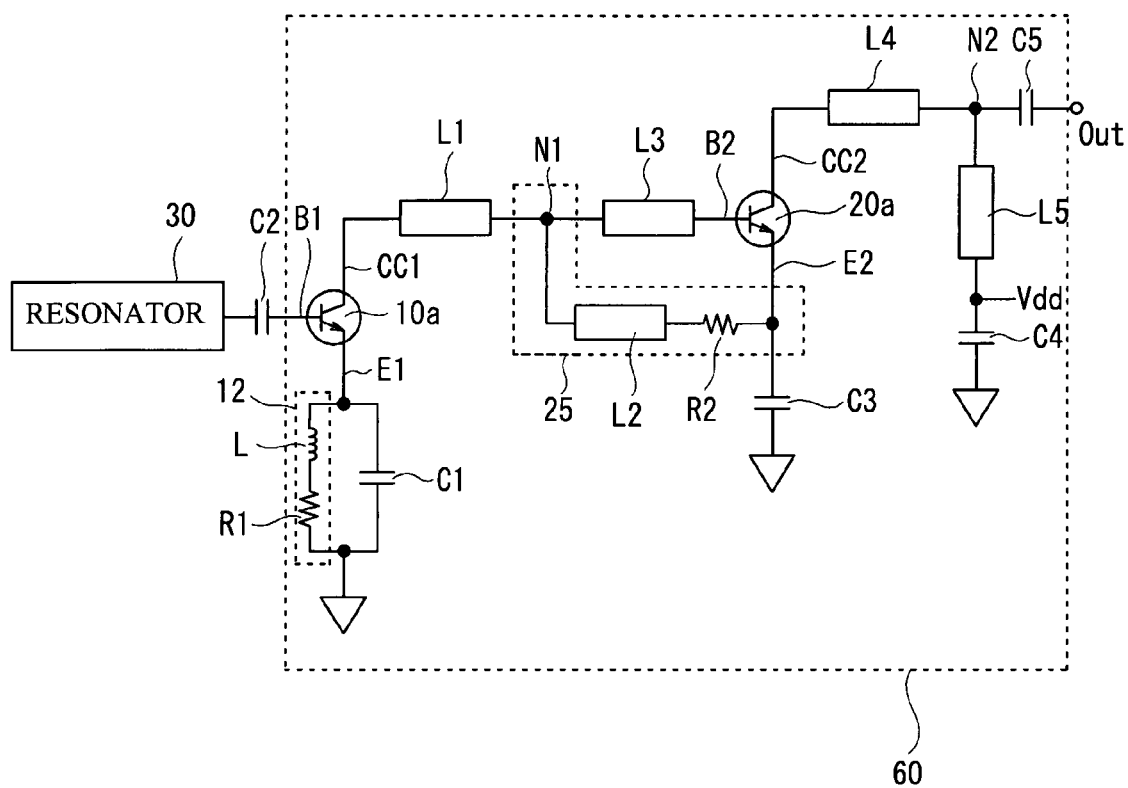
FIG. 7 illustrates a circuit in accordance with a second embodiment.

FIG. 6 illustrates a calculated voltage of a MMIC in which the first transistor 10, the second transistor 20, the elements L1 through L5, the capacitors C1 through C4 and the resistors R1 and R2 are arranged on a same semiconductor substrate 60, the first transistor 10 and the second transistor 20 being made of an InGaAs/GaAs HEMT. FIG. 6 illustrates the output electrical power Pout of a reference wave f0 of 13 GHz, the second harmonic wave 2f0 of 26 GHz and the third harmonic wave 3f0 of 39 GHz at the output portion Out in a case where a sine curve wave of 13 GHz is fed into the gate G1 of the first transistor 10 with an electrical power Pin. The output of the second harmonic wave 2f0 and the third harmonic wave 3f0 are smaller than that of the reference wave f0, because the nonlinearity of the output of the first transistor 10 is small when the electrical power Pin is small. When the electrical power Pin is enlarged, the nonlinearity of the output of the first transistor 10 is enlarged and the nonlinearity is enlarged in the second transistor 20. Thus, the output electrical power Pout of the second harmonic wave 2f0 and the third harmonic wave 3f0 is approximately same as that of the reference wave f0.

In accordance with the first embodiment, the first transistor 10 and the second transistor 20 operate so as to enhance nonlinearity with each other, because the DC bias is applied in series to the first transistor 10 and the second transistor 20 through the path 25. Therefore, a higher harmonic component is generated effectively. And an amplifier is unnecessary and the circuit is downsized. A chip size is reduced when the electronic circuit 50 is an MMIC as illustrated in the first embodiment.

Second Embodiment

A second embodiment is a case where an npn-type bipolar transistor is used as a first transistor 10a and a second transistor 20a. The source S1, the gate G1, and the drain D1 of the first embodiment are displaced to an emitter E1 (a second terminal), a base B1 (a control terminal), and a collector CC1 (a first terminal) of the first transistor 10a respectively. The source S2, the gate G2, and the drain D2 of the first embodiment are displaced to an emitter E2 (a second terminal), a base B2 (a control terminal), and the collector CC2 (a first terminal) of the second transistor 20a respectively. Other components are in common with the first embodiment.

As shown in the first embodiment and the second embodiment, the first transistor 10 and the second transistor 20 may be a field-effect transistor or a bipolar transistor. The first terminal and the second terminal may be a terminal through which the DC bias is applied to the transistor. The control terminal may be a terminal controlling a signal between the first terminal and the second terminal.

It is difficult to manufacture a high-performance oscillator using a frequency of more than 20 GHz. The present invention is effective when an output second harmonic wave and an output third harmonic wave have a frequency of more than 20 GHz. In particular, when the second harmonic wave and the third harmonic wave are a milliwave, it is difficult to manufacture a high-performance oscillator. In this case, the present invention is effective in particular.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-204964 filed on Jul. 27, 2006, the entire disclosure of which is hereby incorporated by reference.

What is claimed is:

1. An electronic circuit device comprising:
    a resonator;
    a negative resistance generating circuit that has a first transistor having a control terminal coupled to the resonator;
    a second transistor that has a control terminal coupled to an output terminal of the first transistor and has an output terminal coupled to a DC bias terminal, wherein the second transistor has the control terminal, a first terminal acting as the output terminal, and a second terminal coupled to the output terminal of the first transistor;
    a path that is coupled to between the DC bias terminal and the output terminal of the first transistor through the second transistor and provides a bias to the first transistor;
    a first inductor provided between the output terminal of the first transistor and a node, the node being coupled to the control terminal of the second transistor and the path;
    a second inductor provided between the node and the second terminal of the second transistor; and
    a resistor provided between the second inductor and the second terminal of the second transistor.

2. The electronic circuit device as claimed in claim 1, wherein the negative resistance generating circuit has a negative resistance generator coupled to the first transistor.

3. The electronic circuit device as claimed in claim 2, wherein the first transistor has the control terminal, a first terminal acting as the output terminal, and a second terminal coupled to the negative resistance generator.

4. The electronic circuit device as claimed in claim 3, wherein the negative resistance generator has a direct current path to which a part of a DC bias applied through the DC bias terminal is applied.

5. The electronic circuit device as claimed in claim 1, wherein the first transistor and the second transistor are arranged on a same semiconductor substrate.

\* \* \* \* \*